United States Patent [19]

Ohkawa

[11] Patent Number: 5,306,966
[45] Date of Patent: Apr. 26, 1994

[54] HIGH-SPEED AND LOW-POWER CONSUMPTION DECODER UNIT IMPLEMENTED BY EMITTER-COUPLED LOGIC CIRCUIT

[75] Inventor: Shi-Ichi Ohkawa, Tokyo, Japan

[73] Assignee: NEC Corporation, Japan

[21] Appl. No.: 883,473

[22] Filed: May 15, 1992

[30] Foreign Application Priority Data

May 28, 1991 [JP] Japan .................................. 3-152604

[51] Int. Cl.⁵ .................................. H03K 19/082
[52] U.S. Cl. .................................. 307/463; 307/455; 365/230.06
[58] Field of Search .................. 307/463, 455, 456; 365/230.06

[56] References Cited

U.S. PATENT DOCUMENTS

| | | | |
|---|---|---|---|
| 4,385,370 | 5/1983 | Isogai | 307/463 |
| 4,647,799 | 3/1987 | Hsu et al. | 307/455 |
| 4,986,666 | 1/1991 | Homma et al. | 365/230.06 |
| 5,021,688 | 6/1991 | LeForestier et al. | 307/463 |
| 5,022,010 | 6/1991 | Chan | 307/463 |

Primary Examiner—Edward P. Westin
Assistant Examiner—Andrew Sanders
Attorney, Agent, or Firm—Laff, Whitesel, Conte & Saret

[57] ABSTRACT

A decoder circuit is implemented by emitter coupled logic circuits, and comprises decoding stages respectively supplied with combinations of component bits, driver stages respectively associated with the decoding stages for driving capacitive loads, and bypassing circuits coupled between the output terminals of the driver stages and a common constant current source, wherein each of the bypassing circuits is implemented by a bipolar transistor having a collector to emitter current path between the associated output terminal and the common constant current source and a base node coupled through a resistive element with the associated output terminal so that discharge current flows through the collector to emitter current path until all the electric charges are evacuated from the capacitive load, thereby increasing operation speed.

2 Claims, 7 Drawing Sheets

HIGH-SPEED AND LOW-POWER CONSUMPTION DECODER UNIT IMPLEMENTED BY EMITTER-COUPLED LOGIC CIRCUIT

FIELD OF THE INVENTION

This invention relates to an emitter coupled logic circuit and, more particularly, to a decoder circuit implemented by the emitter coupled logic circuits.

DESCRIPTION OF THE RELATED ART

A typical example of the decoder circuit implemented by the emitter coupled logic circuits is illustrated in FIG. 1, and largely comprises a plurality of decoding units 11, 12, . . . and 1n respectively associated with output terminals OUT1, OUT2, . . . and OUTn. Each of the decoding units 11 to 1n is broken down into two stages, i.e., a decoder stage 11a, 12a, . . . or 1na and an output driver stage 11b, 12b, . . . or 1nb. Each of the decoder stages 11a to 1na comprises a parallel combination of n-p-n type input transistors Q11 to Q1m, Q21 to Q2m or Qn1 to Qnm coupled between a resistor R1, R2 or Rn and a common emitter node E1, E2 or En, an n-p-n type reference transistor Qr1, Qr2 or Qrn coupled between a high voltage line 21 and the common emitter node E1, E2 or En, and a first constant current source IS1, IS2 or Ied coupled between the common emitter node E1, E2 or En and a low voltage line 22, and the resistors R1 to Rn are further coupled with the high voltage line 21 or a source of ground voltage level. A multi-bit input signal is broken down into n combinations of component bits which are selectively supplied to the base nodes of the n-p-n type input transistors Q11 to Q1m, Q21 to Q2n and Qn1 to Qnm of the decoder stages 11a to 1na. On the other hand, a reference voltage level Vref is supplied to the base nodes of the n-p-n type reference transistors Qr1 to Qrn, and the reference voltage level Vref is adjusted to a certain level between the high and low voltage levels. In this instance, the high and low voltage levels are corresponding to logic "1" level and logic "0" level, respectively. The common collector nodes C1, C2 and Cn of the parallel combinations are respectively coupled with the associated driver stages 11b to 1nb, and each of the driver stages 11b, 12b or 1nb is implemented by a series combination of an n-p-n type driver transistor Qd1, Qd2 or Qdn and a constant current source IS11, IS12 or IS1n. The voltage levels at the common collector nodes C1 to Cn are respectively relayed to the base nodes of the n-p-n type driver transistors Qd1 to Qdn, and capacitive loads CP1, CP2 and CPn are accumulated by the associated n-p-n type driver transistors Qd1 to Qdn or discharged into the associated constant current sources IS11 to IS1n.

The prior art decoder circuit thus arranged behaves as follows. When the component bits of the multi-bit input signal are broken down into the n combinations, the component bits of only one combination are logic "0" level corresponding to the low voltage level. When the n combinations are respectively supplied to the decoder stages 11a to 1na, one of the decoder stages allows all of the n-p-n type input transistors thereof to turn off, and the associated collector node is lifted to the high voltage level. However, each of the other combinations contains at least one component bit of logic "1" level, and the at least one component bit of logic "1" level causes the associated n-p-n type input transistor to turn on. For this reason, the other decoder stages cause the associated collector nodes to go down to the low voltage level. As a result, only one of the n-p-n type driver transistors Qd1 to Qdn turns on, and accumulates the capacitive load. However, the other capacitive loads are discharged to the associated constant current sources, respectively.

If the multi-bit input signal is changed, another combination is constituted by the component bits of logic "0" level, and the decoding units 11 and 1n are assumed to change the collector nodes C1 and Cn from the low voltage level to the high voltage level and from the high voltage level to the low voltage level, respectively. The collector node C1 of the decoding unit 11 allows the n-p-n type driver transistor Qd1 to turn on, and part of current is used for accumulating the associated capacitive load CP1 as shown in FIG. 2A. On the other hand, the collector node Cn of the decoding unit 1n causes the associated n-p-n type driver transistor Qdn to turn off, and current Ib is discharged from the capacitive load CPn to the constant current source IS1n as will be seen from FIG. 2B.

However, a problem is encountered in the prior art decoder unit shown in FIG. 1 in that current consumption is increased together with the capacitive loads CP1 to CPn. In detail, discharge from a capacitive load consumes longer time period rather than accumulation into the capacitive load, and, accordingly, the trailing edge of an output pulse signal tends to be a gentle sloop rather than the leading edge thereof. FIG. 3 shows waveforms at the output terminals upon change of the multi-bit input signal. If the capacitive loads CP1 to CPn are relatively light, the voltage levels at the output terminals OUT1 to OUTn trace broken lines, and the decoding units 11 to 1n complete the alternation at time t2 and t3. The time interval between time t1 and time t3 is slightly longer than the time interval between time t1 and time t2; however, the difference is relatively small. If the capacitive loads CP1 to CPn are increased without any increment of current driving capability of the constant current sources IS11 to IS1n, the voltage levels at the output terminals OUT1 to OUTn trace the real lines. Upon change of the multi-bit input signal, the decoding units 11 to 1n start on altering the associated output terminals OUT1 to OUTn at time t1. Only one of the decoding units 11 to 1n lifts the associated output terminal to the high voltage level, and completes the alternation at time t4. The other decoding units decrease the voltage levels at the associated output terminals, and complete the alternation at time t5. The time interval between times t1 and t5 is much longer than the time interval, between times t1 and t4. The long time interval is as twice long as the short time interval. This tendency becomes serious if the amount of capacitive load is further increased, and the current driving capability of each constant current source IS11 or IS1n is enhanced so as to keep the trailing edges sharp. However, the larger constant current source, the more current consumption. Therefore, the prior art decoder unit shown in FIG. 1 has a trade-off between the alternation speed and the current consumption.

In order to provide a solution of the problem inherent in the prior art decoder circuit shown in FIG. 1, another decoder circuit implemented by the emitter coupled logic circuits is proposed as shown in FIG. 4. The prior art decoder circuit shown in FIG. 4 is similar in circuit arrangement to that shown in FIG. 1 except for diodes D1, D2, ... and Dn coupled between the output terminals OUT1 to OUTn and a constant current source IS20, and, for this reason, the other component elements are labeled with the same references designating the corresponding component elements without detailed description. As described hereinbefore, only one of the decoding units 11 to 1n supplies current to the associated output terminal, and the other decoding units take up currents from the capacitive loads. For this reason, most of current flowing into the constant current source ID20 is participated by electric charges from the capacitive loads, and the increment of current from one of the decoding units 11 to 1n is not so large. However, the constant current source IS20 accelerates the discharge from the capacitive loads, and the problem inherent in the prior art decoder circuit shown in FIG. 1 is solved to a certain extent.

In detail, FIG. 5 shows the voltage levels at the output terminals OUT1 to OUTn upon change of the multibit input signal. One of the decoding units 11 to 1n starts on altering the voltage level at the associated output terminal at time t11, and completes the alternation at time t13 as indicated by plots "SELECTED". On the other hand, the other decoding units start on altering the voltage levels at the associated output terminals at time t11, and complete the alternation at time t14 as indicated by plots "NON-SELECTED". The plots "SELECTED" crosses the plots "NON-SELECTED" at time t12. The time interval between time t11 and time t12 is shorter than that of the decoder circuit shown in FIG. 1, and the switching characteristics are surely improved. However, the time interval between time t12 and time t14 is approximately equal to that of the prior art decoder circuit shown in FIG. 1. This is because of the fact that the diode associated with the selected decoding unit is reversely biased after time t12, and no current flows into the constant current source IS20. Thus, the diodes D1 to Dn associated with the constant current source IS20 are only effective in so far as the capacitive load can forwardly bias the associated diode, and the prior art decoder circuit shown in FIG. 4 can be drastically improve the output voltage characteristics or the alternation speed. Moreover, the diodes D1 to Dn make the plots "SELECTED" gentle after time t12 rather than that of the prior art decoder circuit shown in FIG. 1, because current is short-circuited across the diode associated with the selected decoding unit.

In summary, the prior art decoder circuit shown in FIG. 1 has a trade-off between the alternation speed and the current consumption, and the other prior art decoder circuit shown in FIG. 4 can not drastically improve the alternation speed.

SUMMARY OF THE INVENTION

It is therefore an important object of the present invention provide a decoder circuit which drastically improves alternation speed of the output voltage level without sacrifice current consumption.

To accomplish the object, the present invention proposes to bypass current from a capacitive load through a bipolar transistor.

In accordance with one aspect of the present invention, there is provided an electric circuit implemented by emitter coupled logic circuits, comprising:
a) a logical unit for achieving a predetermined logic operation; b) a plurality of output terminals associated with the logical unit; c) a plurality of driver stages respectively associated with the logical unit for driving the plurality of output terminals, and each implemented by a series combination of a driving bipolar transistor and a constant current source coupled between first and second sources of voltage level different from each other, the driving bipolar transistor having a base node coupled with the logical unit; and d) a plurality of current bypassing circuits respectively associated with the plurality of driver stages, and coupled between the plurality of driver stages and a constant current source, each of the plurality of current bypassing circuits having d-1) a bypassing bipolar transistor coupled between the output terminal of the associated driver stage and the constant current source associated with the plurality of current bypassing circuits, and, d-2) a resistive element coupled between the output terminal and a base node of the bypassing bipolar transistor.

In accordance with another aspect of the present invention, there is provided a decoder circuit comprising: a) a plurality of decoder stages each having a-1) a parallel combination of input bipolar transistors coupled between a common collector node and a common emitter node and provided with respective base nodes supplied with input data bits, a-2) a first resistive element coupled between the common collector node and a first source of voltage level, a-3) a reference bipolar transistor coupled between the first source of voltage level and the common emitter node, and having a base node supplied with a reference voltage level between high and low voltage levels of each of the input data bits, and a-4) a first constant current source coupled between the common emitter node and a second source of voltage level different from the first source of voltage level; b) a plurality of driver stages respectively associated with the plurality of decoder stages, and each implemented by a series combination of a driving bipolar transistor, an output terminal and a second constant current source coupled between the first and second sources of voltage level, the driving bipolar transistor having a base node coupled with the common collector node of the associated decoder stage; and c) a plurality of current bypassing circuits respectively associated with the plurality of driver stages, and coupled between the plurality of driver stages and a third constant current source, each of the plurality of current bypassing circuits having c-1) a bypassing bipolar transistor coupled between the output terminal of the associated driver stage and the third constant current source, and a second resistive element coupled between the output terminal and a base node of the bypassing bipolar transistor.

BRIEF DESCRIPTION OF THE DRAWINGS

The feature and advantages of the decoder unit according to the present invention will be more clearly understood from the following description taken in conjunction with the accompanying drawings in which.

DESCRIPTION OF THE PREFERRED EMBODIMENT

Figure 1:
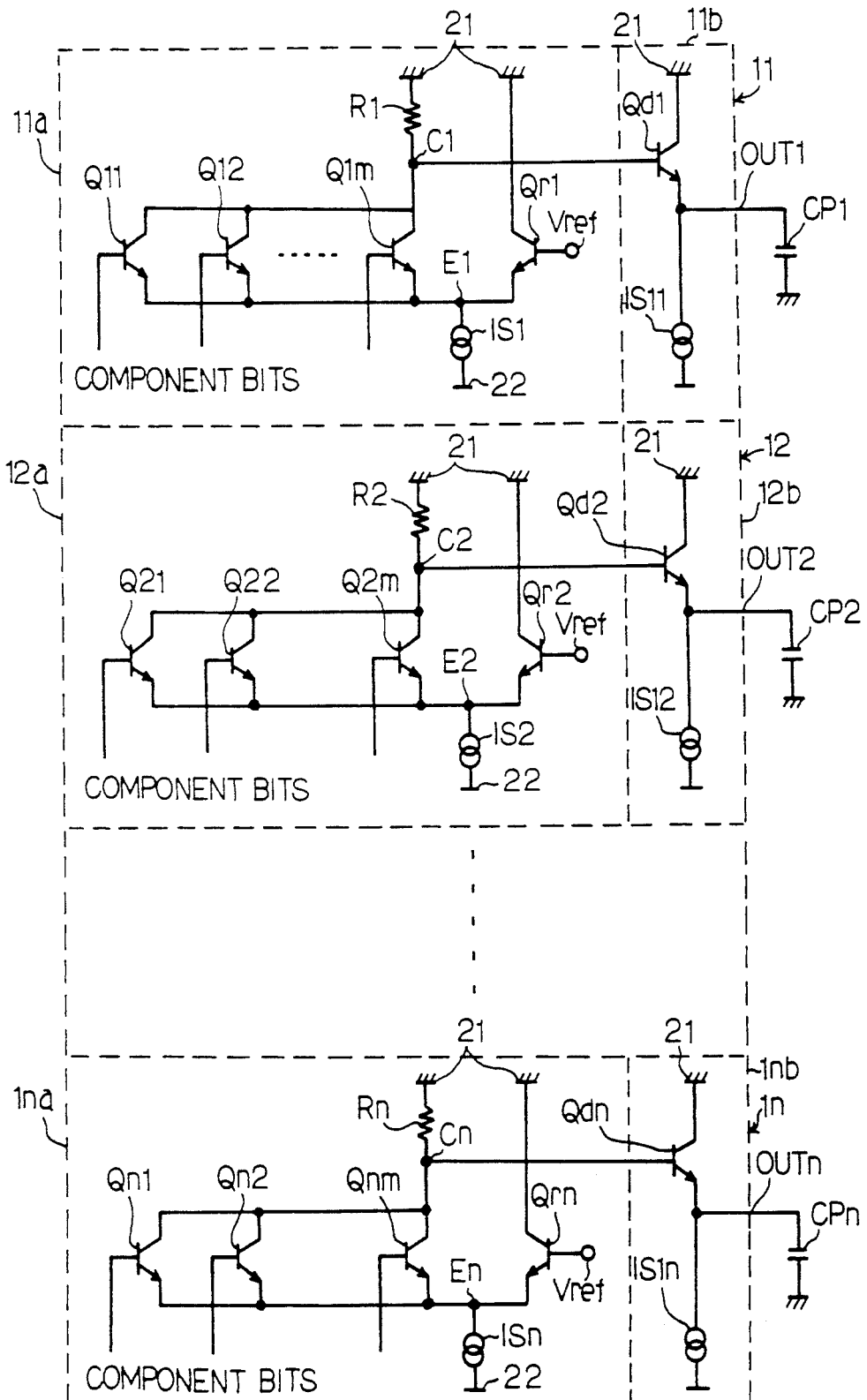
FIG. 1 is a circuit diagram showing the arrangement of the prior art decoder circuit.
Figure 2A:
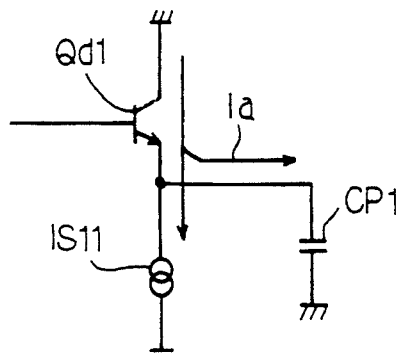
FIGS. 2A and 2B are circuit diagrams showing the behavior of the decoding stages upon change of the multi-bit input signal.
Figure 2B:
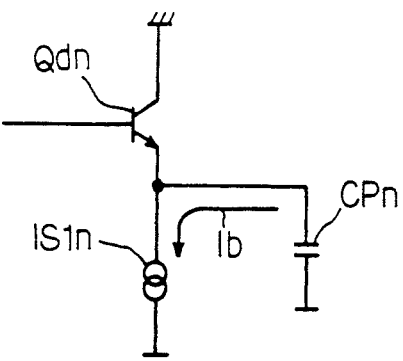
Figure 3:
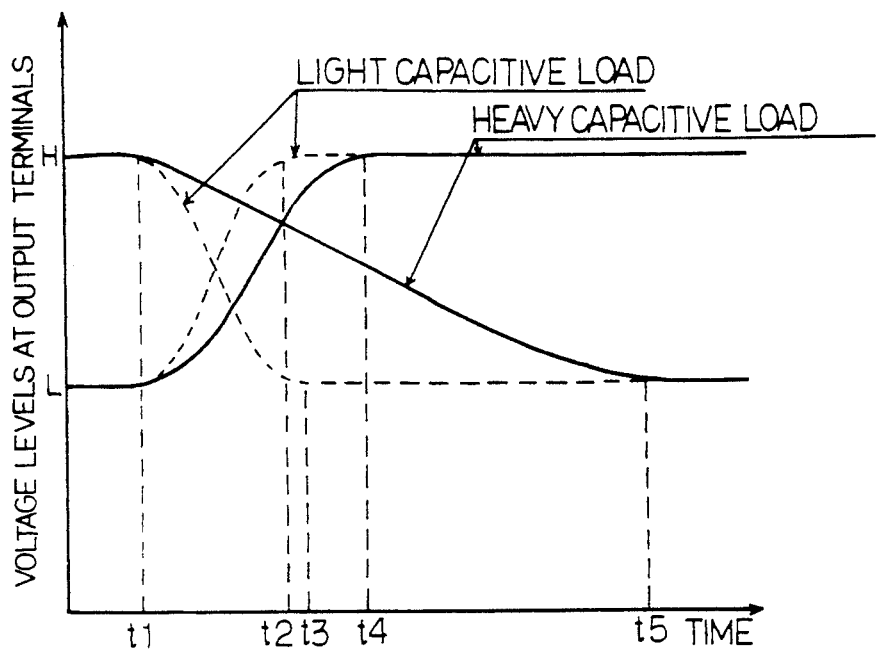
FIG. 3 is a graph showing the output voltage characteristics of the prior art decoder circuit.
Figure 5:
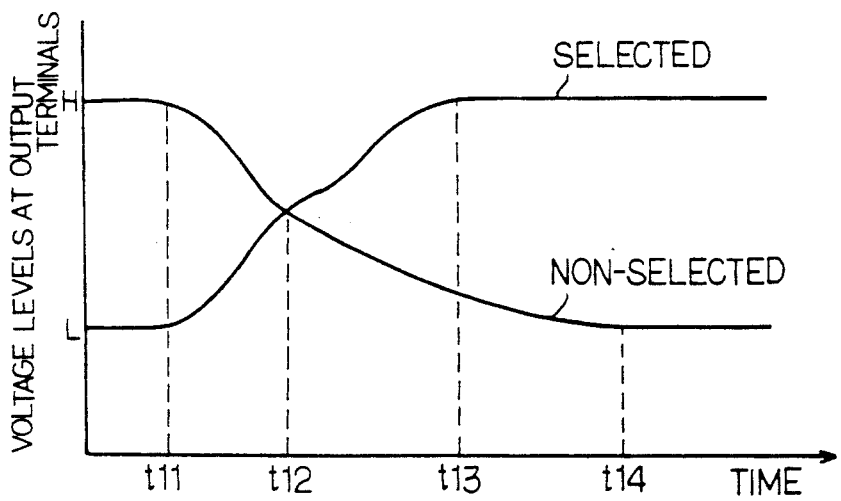
FIG. 5 is a graph showing the output voltage characteristics of the prior art decoder circuit shown in FIG. 4.
Figure 6:
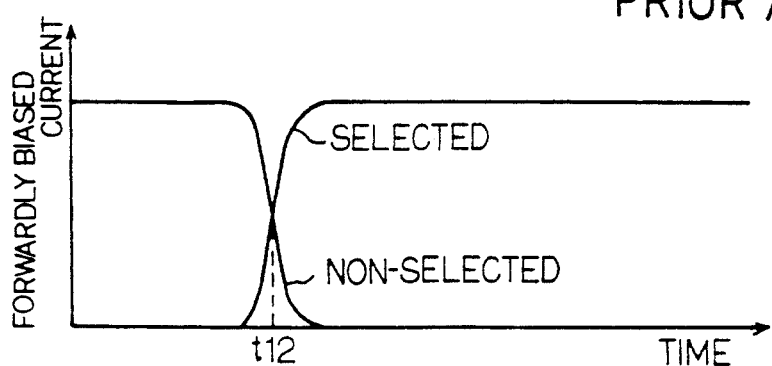
FIG. 6 is a graph showing the forwardly biased current passing through diodes associated with the decoding units of the prior art decoder circuit shown in FIG. 4.
Figure 4:
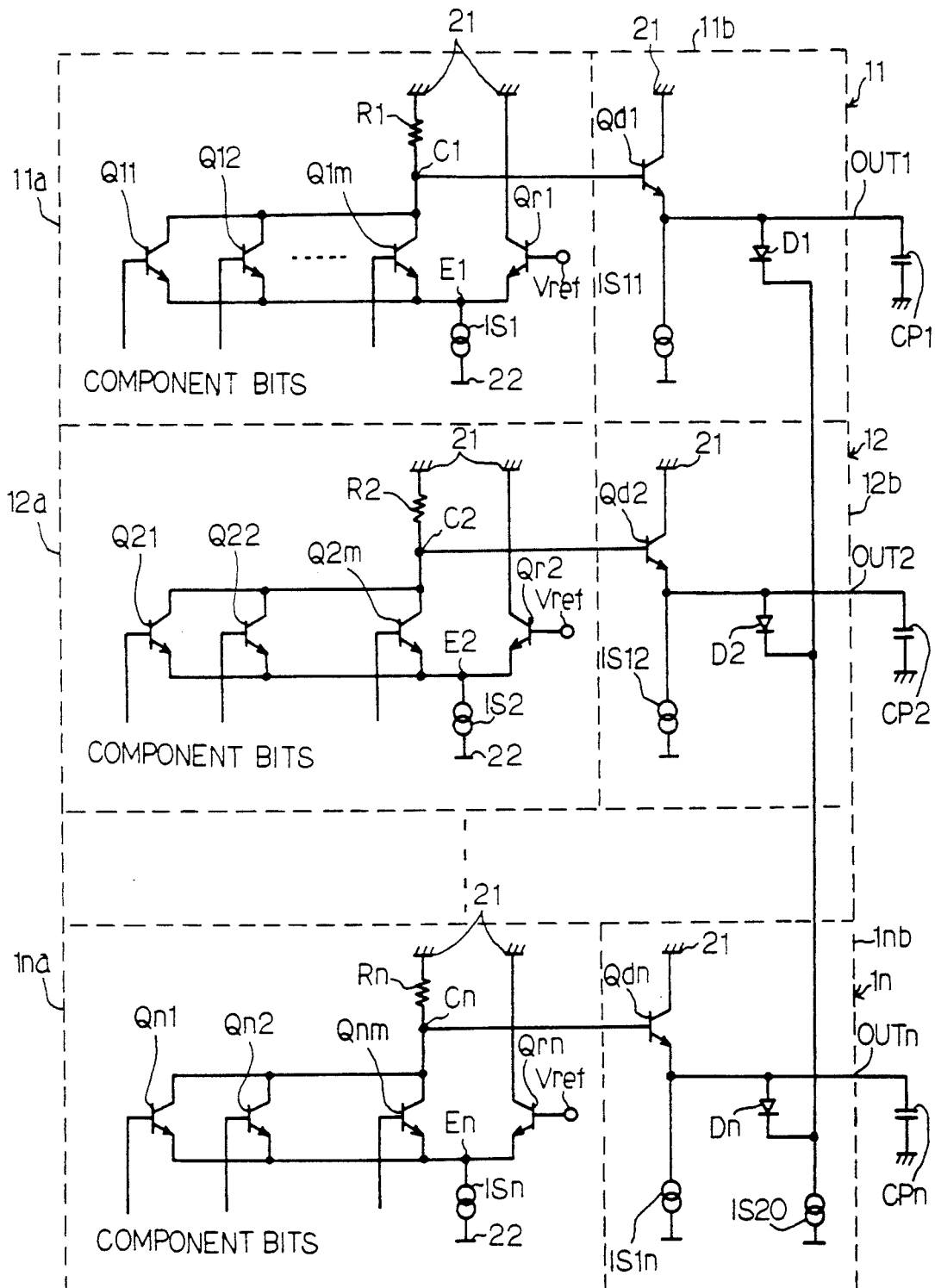
FIG. 4 is a circuit diagram showing the arrangement of another prior art decoder circuit.
Figure 7:
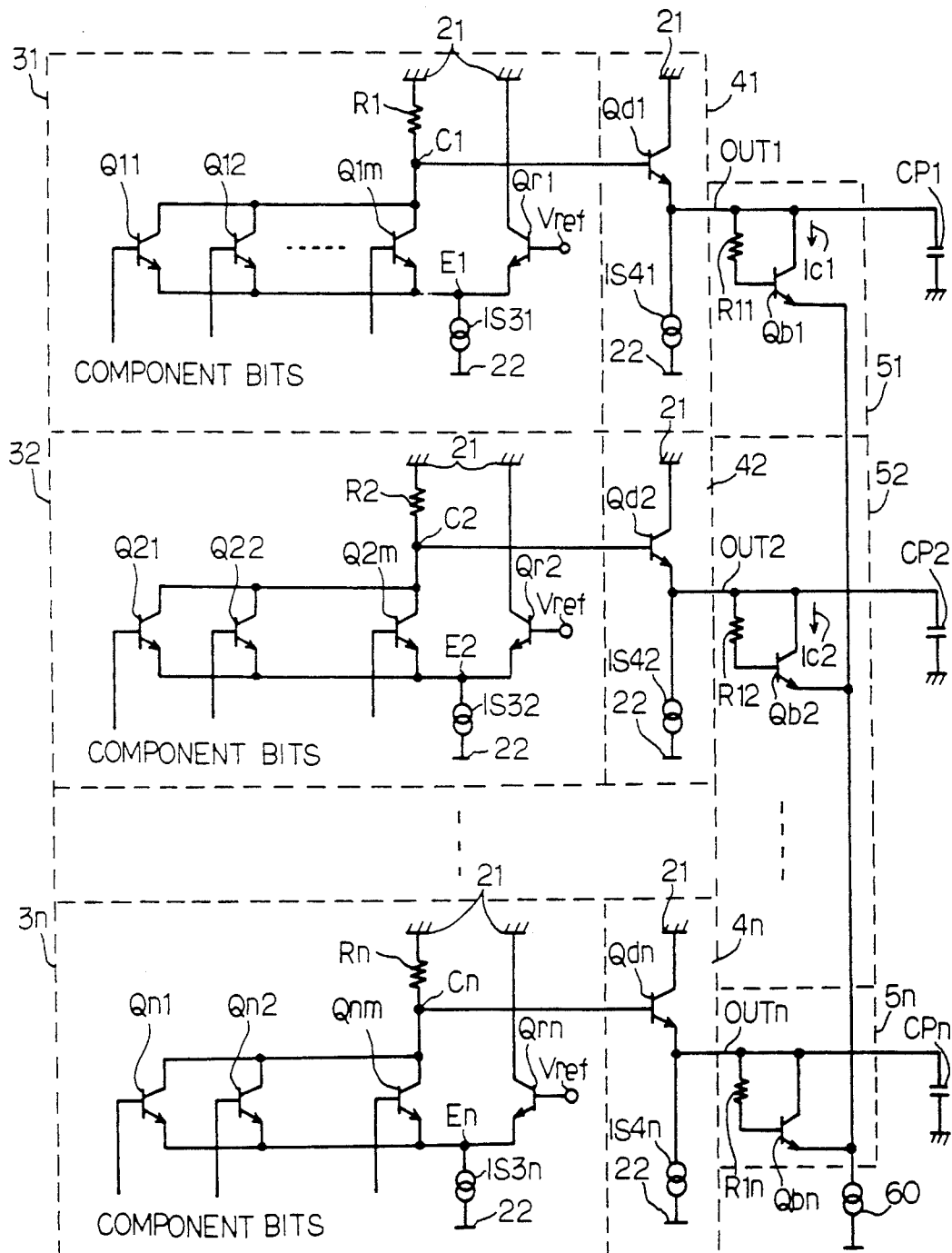
FIG. 7 is a circuit diagram showing the circuit arrangement of a decoder circuit according to the present invention.

Referring to FIG. 7 of the drawings, a decoder circuit embodying the present invention largely comprises a plurality of decoder stages 31, 32, ... and 3n, a plurality of output driver stages 41, 42, ... and 4n respectively associated with output terminals OUT1, OUT2 and OUTn, and a plurality of bypass stages 51, 52 and 5n also associated with the output terminals OUT1 to OUTn, respectively. Each of the decoder stages 31 to 3n comprises a parallel combination of n-p-n type input transistors Q11 to Q1m, Q21 to Q2m or Qn1 to Qnm coupled between a resistor R1, R2 or Rn and a common emitter node E1, E2 or En, an n-p-n type reference transistor Qr1, Qr2 or Qrn coupled between a high voltage line 21 and the common emitter node E1, E2 or En, and a first constant current source IS31, IS32 or IS3n coupled between the common emitter node E1, E2 or En and a low voltage line 22, and the resistors R1 to Rn are further coupled with the high voltage line 21 or a source of ground voltage level.

A multi-bit input signal is broken down into n combinations of component bits, and the n combinations are respectively supplied to the n sets of base nodes of the n-p-n type input transistors Q11 to Q1m, Q21 to Q2n and Qn1 to Qnm. In order to discriminate logic level of the component bit, a reference voltage level Vref is supplied to the base nodes of the n-p-n type reference transistors Qr1 to Qrn, and the reference voltage level Vref is adjusted to a certain level between the high and low voltage levels. In this instance, the high and low voltage levels are corresponding to logic "1" level and logic "0" level, respectively, as similar to the prior art decoder units, and one of the n combinations consists of the component bits of logic "0" level.

The common collector nodes C1, C2 and Cn of the parallel combinations are respectively coupled with the associated driver stages 41 to 4n, and each of the driver stages 41, 42 or 4n is implemented by a series combination of an n-p-n type driver transistor Qd1, Qd2 or Qdn and a second constant current source IS41, IS42 or IS4n coupled between the high and low voltage lines 21 and 22. The voltage levels at the common collector nodes C1 to Cn are respectively relayed to the base nodes of the n-p-n type driver transistors Qd1 to Qdn, and capacitive loads CP1, CP2 and CPn are accumulated by the associated n-p-n type driver transistors Qd1 to Qdn or discharged into the associated second constant current sources IS41 to IS4n.

Each of the bypass stages 51, 52 and 5n comprises an n-p-n type bypass transistor Qb1, Qb2 or Qbn coupled between the associated output terminal OUT1, OUT2 or OUTn and a third constant current source 60, and a resistive element R11, R12 or R1n coupled between the associated output terminal OUT1, OUT2 or OUTn and the base node of the associated n-p-n type bypass transistor Qb1, Qb2 or Qbn.

Figure 8:
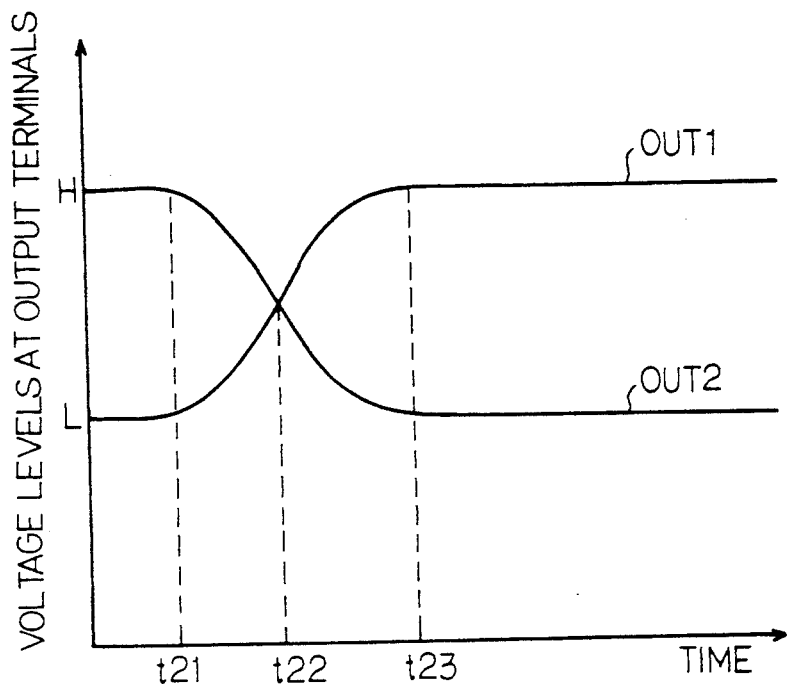
FIG. 8 is a graph showing the voltage levels at two output terminals of the decoder circuit shown in FIG. 7.
Figure 9:
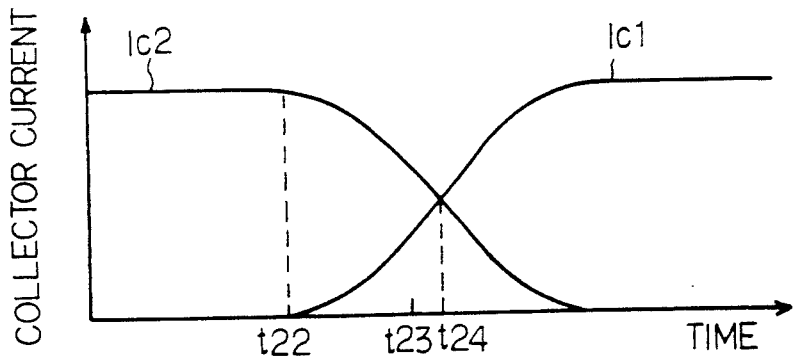
FIG. 9 is a graph showing collector currents of two bypass transistors associated with the two output terminal.

Description is hereinbelow made on circuit behavior on the assumption that the multi-bit input signal causes the output terminal OUT1 to go up instead of the output terminal OUT2. Before the alternation of the multi-bit input signal, the n-p-n type bypass bipolar transistor Qb2 allows collector current Ic2 to flow from the output terminal OUT2 to the third constant current source 60. However, upon the alternation, the low voltage level at the common collector node C2 causes the n-p-n type driver transistor Qd2 to turn off, and the high voltage level at the common collector node C1 allows the n-p-n type driver transistor Qd1 to turn on. Then, the output terminal OUT2 starts on going down at time t22, and the output terminal OUT1 concurrently starts on going up as shown in FIG. 8. The voltage levels at the output terminals OUT1 and OUT2 are balanced with each other at time t22, and the collector current Ic2 is gradually decreased as shown in FIG. 9. On the contrary, the n-p-n type bypass transistor Qb1 gradually increases the collector current Ic1, and the collector currents Ic1 and IC2 are inverted at time t24. However, the output terminals OUT1 and OUT2 substantially reach the high and low voltage levels at time t23, and the n-p-n type bypass transistor Qb2 can discharge current from the capacitive load CP2 until the capacitive load CP2 is evacuated. Thus, time delay is introduced in the decrease of the collector current Ic2 due to the resistive element R12.

Figure 10:
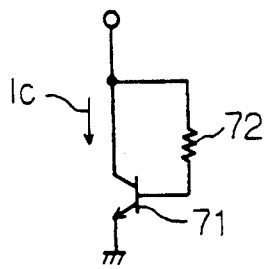
FIG. 10 is a circuit diagram showing the arrangement of one of the bypass units incorporated in the decoder circuit shown in FIG. 7.
Figure 11:
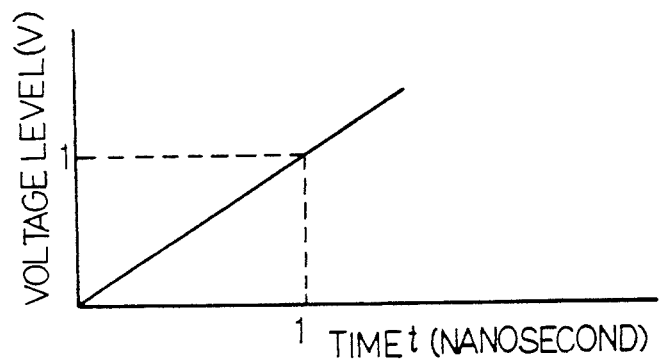
FIG. 11 is a graph showing the voltage level at the collector node of a bypass transistor of the bypass circuit in terms of time.

The reason why the time delay takes place is described hereinbelow with reference to FIGS. 10 to 12. FIG. 10 shows an n-p-n type bipolar transistor 71 which is of an ideal bipolar transistor except for the base transit time tauF. For this reason, the parasitic capacitance, the parasitic resistance and the base-emitter forward voltage drop are assumed to be zero, and the current amplification factor is considered to be infinity. If each of the bypass transistors Qb1 to Qbn is replaced with the n-p-n type bipolar transistor 71, Equation 1 is established between the collector current Ic of the bypass transistor 70 and the base accumulation charges QB.

$$QB = tauF \times Ic \qquad (1)$$

If the increment of the voltage level V(t) at the collector node is expressed as $$V(t) = 10^9 t \qquad (2)$$

The base current Ib is given as $$Ib = 10^9 t / R \qquad (3)$$

where R is the resistance of a resistive element coupled between the collector and the base of the ideal bipolar transistor 71. The base accumulation charges QB is given as $$QB = \int_0^t (1/R) \, 10^9 \, t \, dt$$

$$= (10^9/R)(t^2/2) \qquad (4)$$

From Equations 1 and 4, the collector current Ic is varied as $$\begin{aligned} Ic &= (QB)/(tauF) \\ &= (10^9/(tauF \times R)) \times (t^2/2) \end{aligned} \qquad \text{Equation 5}$$

Figure 12:
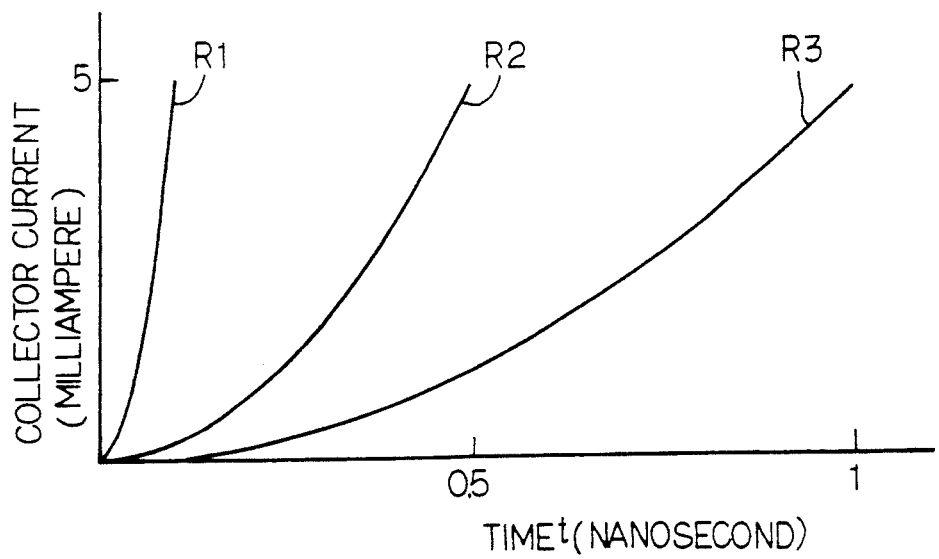
FIG. 12 is a graph showing the collector current of the bypassing transistor in terms of time.

If tauF is 10 ps, the collector current Ic traces plots R1, R2 or R3 of FIG. 12 depending upon the resistance R. Plots R1 stands for R=1 kilo-ohms, R2 is indicative of R=5 kilo-ohms, and R3 is representative of R3=10 kilo-ohms. Thus, the resistive element 72 is causative of the time delay, and the amount of the time delay depends on resistance R.

As will be understood from the foregoing description, the resistive elements R11 to R1n allows the associated n-p-n bypass transistors Qb1 to Qbn to remain on, and the n-p-n type bypass transistors Qb1 to Qbn can bypass currents from the capacitive loads CP1 to CPn. This results in improvement in alternation speed. Moreover, only one of the n-p-n type driver transistors Qd1 to Qdn is turned on, and most of the current flowing into the third constant current source 60 is participated by the currents from the capacitive loads. For this reason, the alternation speed is improved without sacrifice of the current consumption.

Although particular embodiments of the present invention have been shown and described, it will be obvious to those skilled in the art that various changes and modifications may be made without departing from the spirit and scope of the present invention. For example, the bypass stages are effective against delay of current discharge inherent in the driver stages each implemented by a bipolar transistor and a constant current source, and, for this reason, the present invention is applicable to various circuit arrangements with the driver stages.

What is claimed is:

1. An electric circuit implemented by emitter coupled logic circuits, said circuit comprising:
   a) a logical unit for achieving a predetermined logic operation;
   b) a plurality of output terminals associated with said logical unit;
   c) a plurality of driver stages associated with said logical unit for driving said plurality of output terminals, and each of said driver stages being implemented by a series combination of a driving bipolar transistor and a constant current source coupled between first and second sources of voltage, said first and second voltage sources having levels which are different from each other, said driving bipolar transistors respectively having an individually associated base node coupled with output nodes of said logical unit and respective emitter node respectively coupled with said plurality of output terminals; and
   a plurality of current bypassing circuit respectively associated with said plurality of driver stages, and coupled between said plurality of output terminals and a constant current source, each of said plurality of current bypassing circuits having d-1) a bypassing bipolar transistor having a collector-and-emitter current path coupled between the associated output terminal and said constant current source associated with said plurality of current bypassing circuits, and d-2) a resistive element coupled between said associated output terminal and a base node of said bypassing bipolar transistor.

2. A decoder circuit comprising:
   a) a plurality of decoder stages each having a-1) a parallel combination of input bipolar transistors having respective collector-and-emitter current paths coupled between a common collector node and a common emitter node and respective base nodes supplied with input data bits respectively, a-2) a first resistive element coupled between said common collector node and a first source of voltage level, a-3) a reference bipolar transistor having a collector-and-emitter current path coupled between said first source of voltage level and said common emitter node and a base node supplied with a reference voltage level between high and low voltage levels of each of said input data bits, and a-4) a first constant current source coupled between said common emitter node and a second source of voltage having a level which is different from the level of said first source of voltage;
   b) a plurality of driver stages respectively associated with said plurality of decoder stages, each of said driver stages being implemented by a series combination of a driving bipolar transistor, an output terminal and a second constant current source, the series combination being coupled between said first and second sources of voltage level, said driving bipolar transistor having a base node coupled with said common collector node of the associated decoder stage; and
   c) a plurality of current bypassing circuits respectively associated with said plurality of driver stages, and coupled between said plurality of driver stages, and coupled between said plurality of driver stages and a third constant current source, each of said plurality of current bypassing circuits having c-1) a bypassing bipolar transistor having a collector-and-emitter current path coupled between said output terminal of the associated driver stage and said third constant current source, and c-2) a second resistive element coupled between said associated output terminal and a base node thereof.

* * * * *